United States Patent [19]

Aurichio

[11] Patent Number: 5,158,818

[45] Date of Patent: Oct. 27, 1992

[54] CONDUCTIVE DIE ATTACH TAPE

[75] Inventor: Joseph A. Aurichio, Anderson, S.C.

[73] Assignee: National Starch and Chemical Investment Holding Corporation, Wilmington, Del.

[21] Appl. No.: 773,849

[22] Filed: Sep. 9, 1989

Related U.S. Application Data

[63] Continuation of Ser. No. 574,815, Jan. 30, 1984, abandoned.

[51] Int. Cl.$^5$ .............................................. B32B 9/00
[52] U.S. Cl. ................................ 428/40; 428/195; 428/198; 428/209; 428/220; 428/323; 428/328; 428/332; 428/337; 428/901; 428/908; 206/228; 206/330; 156/60; 156/233
[58] Field of Search ................ 206/228, 350; 428/195, 428/198, 209, 901, 908, 323, 328, 40, 220, 332, 337; 156/60, 233; 427/96

[56] References Cited

U.S. PATENT DOCUMENTS 4,687,693 8/1987 Sheyon et al. ................. 428/198
4,961,804 10/1990 Aurichio ......................... 156/248

*Primary Examiner*—Patrick J. Ryan

[57] ABSTRACT

A conductive die attach tape is described which allows for mounting of diced semiconductor chips thereon, followed by removal of the chip with an adherent conductive adhesive, and the mounting of the chip/adhesive combination in a chip carrier preparatory to the wire bonding operation.

33 Claims, 1 Drawing Sheet

CONDUCTIVE DIE ATTACH TAPE

This is a continuation of application Ser. No. 574,815 filed Jan. 30, 1984.

BACKGROUND OF THE INVENTION

Silicon wafers with multiple printed circuitry are diced (or sawed) into individual circuits (chips) by first placing the wafer onto a dicing film (a polymeric support film having a tacky surface) which holds the wafer in place during the dicing operation. The wafer is then partially cut through its thickness by the dicing implement (e.g., a diamond-impregnated wheel). The wafer is then cracked into individual chips and separated by stretching the support film. The chips are then picked up individually by a vacuum chuck to be placed onto the chip carrier (previously treated with adhesive to hold the chip). The adhesive is then cured to secure the chip into place and provide a ground for the chip during the step in which wires are bonded to the chip. There are a number of current methods of application of the adhesive to the chip carrier (e.g., use of syringe, use of stamp pad, use of other dispensing technique). Most methods cannot offer uniform adhesive thickness, and some are cumbersome and time consuming in application.

SUMMARY OF THE PRESENT INVENTION

The present invention is directed to a tape product which would provide the desired degree of adhesive uniformity in terms of thickness and area of coverage to the chip. It comprises a support tape with a pattern of adhesive of a size and shape to support at least one semiconductor chip thereon. The individual chips would be each positioned over a corresponding adhesive support and contacted therewith. After contact between chip and support film/adhesive has been made, the chip is removed from the film with its adherent adhesive support attached. This chip/adhesive composite can then be placed into a suitable chip carrier and cured in an appropriate fashion. Afterwards, wires can be bonded to the chip as conventionally performed.

DESCRIPTION OF THE DRAWINGS

The Drawings which form a portion of the present specification are descriptive of certain embodiments of the present invention wherein.

DETAILED DESCRIPTION OF THE PRESENT INVENTION

Figure 1:
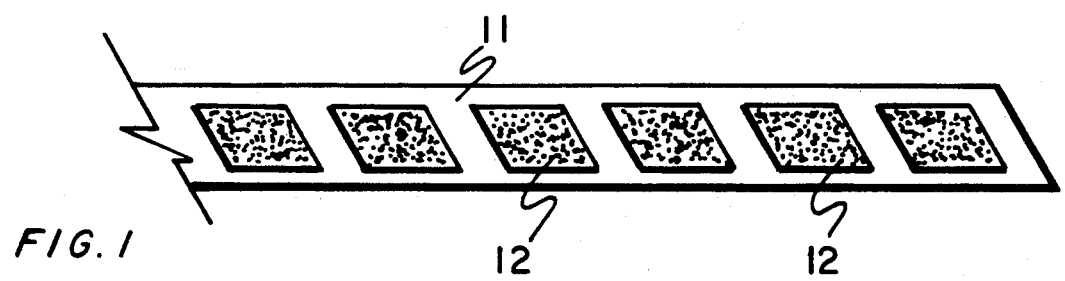
FIG. 1 is a perspective view of the conductive die attach tape of the present invention.
Figure 2:
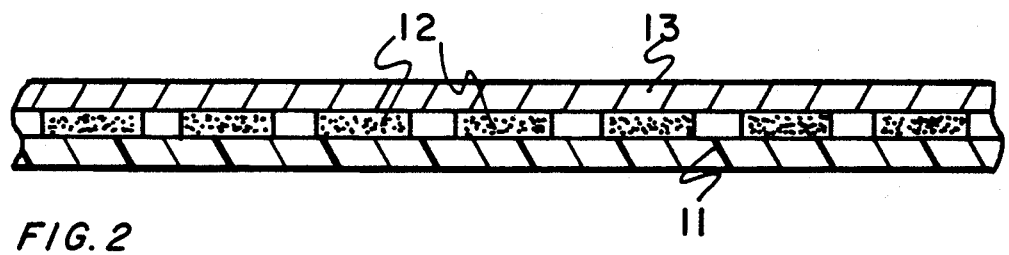
FIG. 2 is a cross sectional view of a preferred embodiment of the invention wherein a release liner (or cover sheet) is affixed over the adhesive to protect it from contamination by foreign matter.

The present invention relates to a conductive die attach tape comprising a support film and an adhesive pattern which can support a semiconductor chip prior to its removal (with attached adhesive) from the film and its placement in a suitable chip carrier.

The die attach tape of the present invention comprises a support film 11 with a suitable pattern of adhesive 12 and, in a preferred embodiment, a release liner 13 to protect the adhesive from contamination from foreign matter (e.g., dirt, dust, etc.). The adhesive 12 needs to release from the support film 11 when the chip/adhesive combination is removed therefrom. Therefore, it is generally desired that a suitable release layer be placed on the support film 11 to lie between it and the adhesive 12.

Representative support films 11 which can be used in the product of the present invention include paper as well as those made from such well known thermoplastic polymers as olefin polymers (e.g., polyethylene or polypropylene), vinyl halide polymers, and polyester. The thickness of the support film can range from about 12 to about 250 microns, with a thickness of about 50 to about 125 microns being preferred.

Coated on one side of the support film, in a preferred embodiment, is a suitable release layer which, as will be mentioned below, allows for easy separation of the conductive adhesive/chip combination from the support film 11 prior to placement in the chip carrier. Representative release layers can comprise silicone and fluorocarbon compositions such as those described in the prior art (e.g., in U.S. Pat. Nos. 3,912,569 and 3,575,917 to A. M. Kapral). These release layers need only be thick enough to confer the desired release properties (e.g., from about 0.23 to about 0.91 kg. per ream). If the surface of the support film has an inherent release layer function (polyfluorocarbon), the inherent release characteristics of its surface can be utilized in accordance with the present invention as the "release layer". A commercial source of suitable silicone release coated polymeric film (e.g., polypropylene with SILOX brand release coating) is Akrosil Corporation of Menasha, Wisc.

It is also possible to dispense with the release layer if polymers having a release feature upon heating are used. For example, a polyolefin film 11, such as polypropylene, can be heated (e.g., for 0.25-3 minutes at 45° C.-70° C.) after the chip and adhesive are bonded to one another to insure later clean release of the chip/adhesive composite.

Attached to the exposed surface of the release layer (or the film 11, if no release layer is used) is a suitable pattern of conductive adhesive 12 to form a point of attachment for the semiconductor chips that are to be later transferred to a chip carrier. Generally, the conductive adhesive pattern can comprise a series of square adhesive patterns of a suitable size and a suitable shape to approximate the area of the chip to be mounted thereon. The thickness of the adhesive can range from about 5 microns to about 75 microns. Suitable conductive adhesive compositions which can be utilized include those adhesive materials which are loaded with fillers to effect conductivity requirements (e g., 2% to about 90%, by weight of a suitable conductive material). Representative conductive materials include finely divided conductive metals (e.g., aluminum, copper, silver, gold, palladium), or carbon black. Representative adhesive materials which can form a matrix for the conductive materials include polyimide, acrylic, epoxy, silicones, and various modified polymeric materials to meet desired thermal and conductivity requirements. One suitable adhesive is a silver filled polyimide (P-1011 brand from Epoxy Technology, Inc.).

In a preferred embodiment, the film product of the present invention also includes a suitable release liner 13 over the exposed surface of the adhesive to protect it from contamination and/or damage (e.g., inadvertent destruction of the preferred, substantially flat upper surface). For example, release coated paper can be employed as the release liner material. The release liner can have a differing release characteristic than the release layer if a release layer is used on the support film 11.

The film of the present invention can be formed using conventional lamination and printing operations. The release layer can, for example, be coated onto the support film by using conventional coating techniques followed by drying of the layer. The pattern of conductive adhesive is then applied to the dried release layer surface by appropriate printing procedures, e.g., screen printing or stamping processes, and then the adhesive is transferred to the support film 12 by lamination. If a release liner is desired over the exposed surface of the adhesive, it can also be applied by conventional lamination procedures.

What is claimed:

1. A conductive die attach tape useful in releasably supporting semiconductor chips on a conductive adhesive which comprises:
   (a) a support film having a thickness of from about 12 to about 250 microns; and
   (b) a pattern of curable conductive adhesive having a thickness of from about 5 microns to about 75 microns, being of a size and shape to support at least one semi-conductor chip thereon, releasably affixed to one side of the support film, such that the adhesive pattern is transferable to the surface of the semi-conductor chip after its bonding to and removal from the support film.

2. A tape as claimed in claim 1 in which the support film is formed of a polyolefin polymer.

3. A tape as claimed in claim 1 wherein the support film is polyethylene.

4. A tape as claimed in claim 1 wherein the support film has a thickness of from about 50 microns to about 125 microns.

5. A tape as claimed in claim 1 which further comprises a release layer on the film between it and the adhesive.

6. A tape as claimed in claim 5 wherein the release layer comprises a silicone composition.

7. A tape as claimed in claim 5 wherein the release layer comprises a fluorocarbon composition.

8. A tape as claimed in claim 1 wherein the conductive adhesive contains an effective amount for conductivity of a conductive metal in an adhesive matrix.

9. A tape as claimed in claim 2 wherein the support film has a thickness of from about 50 microns to about 125 microns.

10. A tape as claimed in claim 9 which has a release layer on the film between it and the adhesive, said release layer comprising a silicone composition.

11. A tape as claimed in claim 1 which also has a release liner over the pattern of conductive adhesive.

12. A film as claimed in claim 11 which also has a release liner over the pattern of conductive adhesive.

13. In combination, a semiconductor chip and the tape product of claim 1.

14. In combination, a semiconductor chip and the tape product of claim 2.

15. In combination, a semiconductor chip and the tape product of claim 3.

16. In combination, a semiconductor chip and the tape product of claim 4.

17. In combination, a semiconductor chip and the tape product of claim 5.

18. In combination, a semiconductor chip and the tape product of claim 6.

19. In combination, a semiconductor chip and the tape product of claim 7.

20. In combination, a semiconductor chip and the tape product of claim 9.

21. In combination, a semiconductor chip and the tape product of claim 10.

22. In combination, a semiconductor chip and the tape product of claim 11.

23. In combination, a semiconductor chip and the tape product of claim 12.

24. A method of mounting a semiconductor chip in a chip carrier which comprises bonding the chip to the tape product of claim 1, thereafter removing the chip and adherent conductive adhesive from the support film, and bonding the chip and adherent conductive adhesive to a chip carrier.

25. A method of mounting a semiconductor chip in a chip carrier which comprises bonding the chip to the tape product of claim 2, thereafter removing the chip and adherent conductive adhesive from the support film, and bonding the chip and adherent conductive adhesive to a chip carrier.

26. A method of mounting a semiconductor chip in a chip carrier which comprises bonding the chip to the tape product of claim 3, thereafter removing the chip and adherent conductive adhesive from the support film, and bonding the chip and adherent conductive adhesive to a chip carrier.

27. A method of mounting a semiconductor chip in a chip carrier which comprises bonding the chip to the tape product of claim 4, thereafter removing the chip and adherent conductive adhesive from the support film, and bonding the chip and adherent conductive adhesive to a chip carrier.

28. A method of mounting a semiconductor chip in a chip carrier which comprises bonding the chip to the tape product of claim 5, thereafter removing the chip and adherent conductive adhesive from the support film, and bonding the chip and adherent conductive adhesive to a chip carrier.

29. A method of mounting a semiconductor chip in a chip carrier which comprises bonding the chip to the tape product of claim 6, thereafter removing the chip and adherent conductive adhesive from the support film, and bonding the chip and adherent conductive adhesive to a chip carrier.

30. A method of mounting a semiconductor chip in a chip carrier which comprises bonding the chip to the tape product of claim 7, thereafter removing the chip and adherent conductive adhesive from the support film, and bonding the chip and adherent conductive adhesive to a chip carrier.

31. A method of mounting a semiconductor chip in a chip carrier which comprises bonding the chip to the tape product of claim 9, thereafter removing the chip and adherent conductive adhesive from the support film, and bonding the chip and adherent conductive adhesive to a chip carrier.

32. A method of mounting a semiconductor chip in a chip carrier which comprises bonding the chip to the tape product of claim 10, thereafter removing the chip and adherent conductive adhesive from the support film, and bonding the chip and adherent conductive adhesive to a chip carrier.

33. A method of mounting a semiconductor chip in a chip carrier which comprises bonding the chip to the tape product of claim 11, thereafter removing the chip and adherent conductive adhesive from the support film, and bonding the chip and adherent conductive adhesive to a chip carrier.

* * * * *